United States Patent
Abe

(10) Patent No.: US 11,721,529 B2
(45) Date of Patent: Aug. 8, 2023

(54) BONDING STRUCTURE AND BONDING METHOD FOR BONDING FIRST CONDUCTIVE MEMBER AND SECOND CONDUCTIVE MEMBER, AND SUBSTRATE PROCESSING APPARATUS

(71) Applicant: TOKYO ELECTRON LIMITED, Tokyo (JP)

(72) Inventor: Junichi Abe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 584 days.

(21) Appl. No.: 16/928,781

(22) Filed: Jul. 14, 2020

(65) Prior Publication Data

US 2021/0020414 A1 Jan. 21, 2021

(30) Foreign Application Priority Data

Jul. 19, 2019 (JP) .................................. 2019-134074

(51) Int. Cl.
  *H01J 37/32* (2006.01)
  *H01L 23/00* (2006.01)

(52) U.S. Cl.
  CPC ........ *H01J 37/32458* (2013.01); *H01L 24/14* (2013.01)

(58) Field of Classification Search
  CPC ...................... H01J 37/32458; H01J 37/32513
  See application file for complete search history.

(56) References Cited

U.S. PATENT DOCUMENTS

2020/0257147 A1* 8/2020 Mitsui ................... G02F 1/1339

FOREIGN PATENT DOCUMENTS

| JP | 2002534785 A | 10/2002 |
|---|---|---|
| JP | 2009-253161 A | 10/2009 |
| JP | 2010016086 A | 1/2010 |
| WO | WO 00/40771 A1 | 7/2000 |

* cited by examiner

*Primary Examiner* — Joseph L Williams
(74) *Attorney, Agent, or Firm* — Fenwick & West LLP

(57) ABSTRACT

A bonding structure for bonding a first conductive member and a second conductive member forming a processing container having therein a processing region for processing a substrate is provided. The processing region is isolated from an outside region. In the bonding structure, a bonding interface is formed between the first conductive member and the second conductive member, an endless first sealing groove and an endless second sealing groove face the bonding interface while being separated from each other, a first sealing member is fitted in the first sealing groove and a second sealing member is fitted in the second sealing groove, and gaps formed by surface irregularities of the bonding interface between the first sealing groove and the second sealing groove communicate with the outside region.

14 Claims, 4 Drawing Sheets

BONDING STRUCTURE AND BONDING METHOD FOR BONDING FIRST CONDUCTIVE MEMBER AND SECOND CONDUCTIVE MEMBER, AND SUBSTRATE PROCESSING APPARATUS

CROSS-REFERENCE TO RELATED APPLICATIONS

This application claims priority to Japanese Patent Application No. 2019-134074, filed on Jul. 19, 2019, the entire contents of which are incorporated herein by reference.

TECHNICAL FIELD

The present disclosure relates to a bonding structure and a bonding method for bonding a first conductive member and a second conductive member, and a substrate processing apparatus.

BACKGROUND

Japanese Patent Application Publication No. 2009-253161 discloses a plasma processing container including a container main body formed by bonding a plurality of container members, a first sealing member disposed at a joint portion between the container members, and protective members attached to an inner surface of the container main body to protect the container main body. By inserting one of the protective members into the joint portion between the container members from an inner side of a processing chamber to a position that reaches the first sealing member, the first sealing member and the corresponding protective member are brought into contact with each other, thereby forming a first sealing portion. In accordance with the plasma processing container disclosed in Japanese Patent Application Publication No. 2009-253161, plasma or a corrosive gas is blocked by the first sealing portion and does not reach a position where a sidewall and a ceiling plate are in direct contact with each other, so that it is not necessary to perform alumite-treatment of the ceiling plate.

The present disclosure provides a bonding structure and a bonding method for bonding a first conductive member and a second conductive member, which are advantageous in suppressing leakage of the processing atmosphere of a processing region of a bonding interface between two conductive members forming a processing container for processing a substrate, and a substrate processing apparatus.

SUMMARY

In accordance with an aspect of the present disclosure, there is provided a bonding structure for bonding a first conductive member and a second conductive member forming a processing container having therein a processing region for processing a substrate, the processing region being isolated from an outside region, the bonding structure including: a bonding interface formed between the first conductive member and the second conductive member; an endless first sealing groove and an endless second sealing groove facing the bonding interface while being separated from each other; a first sealing member fitted in the first sealing groove and a second sealing member fitted in the second sealing groove; and gaps formed by surface irregularities of the bonding interface between the first sealing groove and the second sealing groove that communicate with the outside region.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
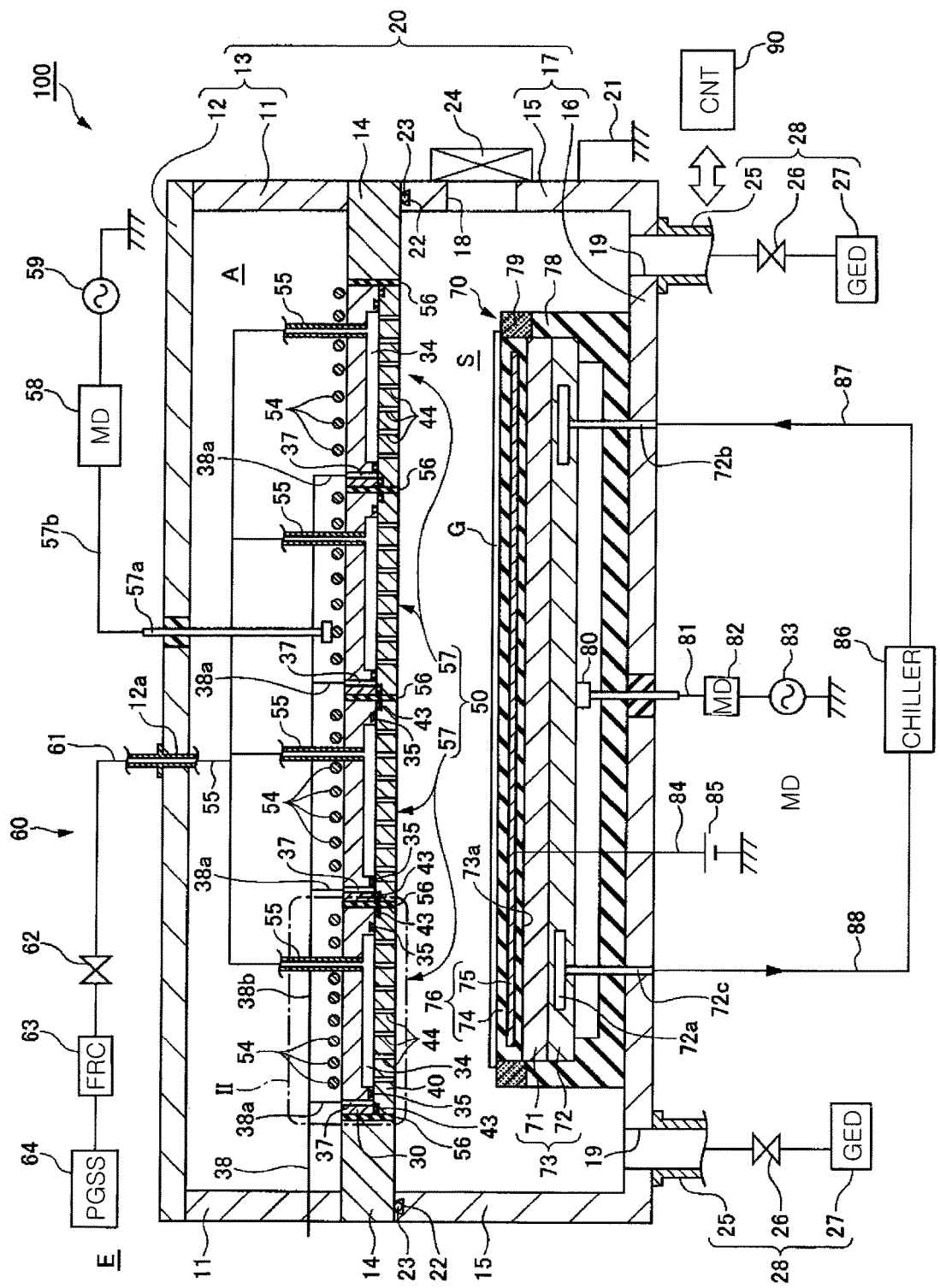
FIG. 1 is a vertical cross-sectional view showing an example of a substrate processing apparatus according to an embodiment.

Hereinafter, a bonding structure and a bonding method for bonding a first conductive member and a second conductive member and a substrate processing apparatus according to embodiments of the present disclosure will be described with reference to the accompanying drawings. Throughout the specification and the drawings, like reference numerals will be given to substantially like parts and redundant description thereof will be omitted.

Embodiments

<Substrate Processing Apparatus>

Figure 2:
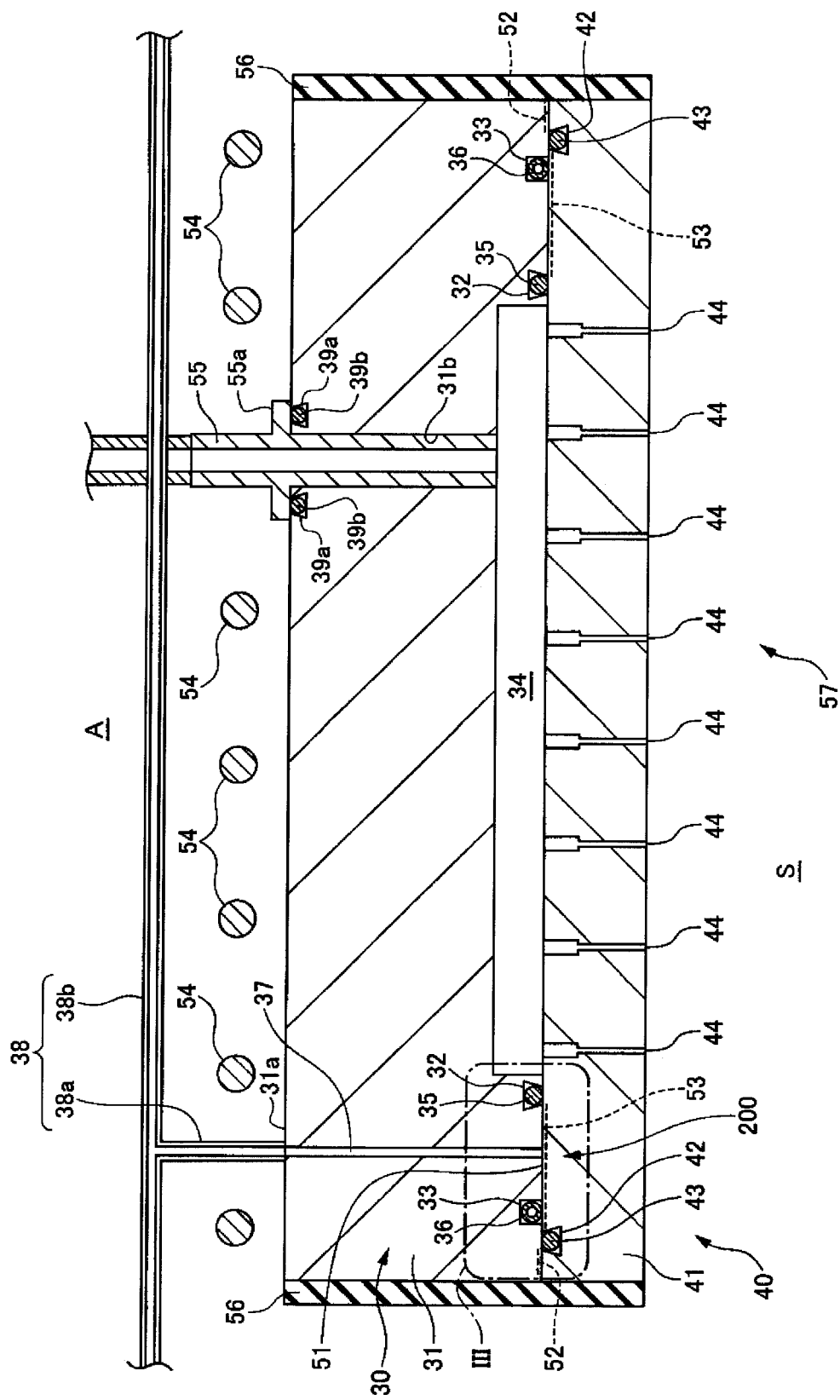
FIG. 2 is an enlarged view of a "II" portion of FIG. 1 and is a vertical cross-sectional view showing an example of a bonding structure for bonding a first conductive member and a second conductive member according to the embodiment.

First, an example of a substrate processing apparatus according to an embodiment of the present disclosure will be described with reference to FIGS. 1 and 2. FIG. 1 is a vertical cross-sectional view showing an example of the substrate processing apparatus according to the embodiment. FIG. 2 is an enlarged view of a "II" portion shown in FIG. 1 and is a vertical cross-sectional view showing an example of a bonding structure for bonding a first conductive member and a second conductive member according to the embodiment.

The substrate processing apparatus 100 shown in FIG. 1 is an inductively coupled plasma (ICP) processing apparatus for performing various substrate treatments on a substrate G having a rectangular shape in plan view (hereinafter, simply referred to as "substrate") for a flat panel display (hereinafter, referred to as "FPD"). The substrate is mainly made of glass and may be made of transparent synthetic resin or the like depending on its application. Here, the substrate treatments include etching, film formation using a chemical vapor deposition (CVD) method, and the like. The FPD includes, e.g., a liquid crystal display (LCD), an electroluminescent (EL) display, and a plasma display panel (PDP), or the like. The substrate includes a supporting substrate as well as a substrate on which a circuit is patterned. The planar dimensions of the FPD substrate increase along with the progression of generations. The average planar dimensions of the substrate G processed by the substrate processing apparatus 100 at least include dimensions from about 1500 mm×1800 mm in the sixth generation to about 3000 mm×3400 mm in the 10.5 generation. Further, the thickness of the substrate G is about 0.2 mm to several mm.

The substrate processing apparatus 100 shown in FIG. 1 includes a rectangular parallelepiped box-shaped processing container 20, a substrate support 70 disposed in the processing container 20 and having a rectangular shape in plan view, the substrate support 70 having thereon the substrate G, and a controller (CNT) 90. The processing container 20 may alternatively have a circular box shape, an elliptical box shape, or the like. In that case, the substrate support also has a circular shape or an elliptical shape, and the substrate placed on the substrate support also has a circular shape or an elliptical shape.

The processing container 20 is divided into an upper space and a lower space by a metal window 50. An antenna chamber A that is the upper space is defined by an upper chamber 13, and a processing region S (processing chamber) that is the lower space is defined by a lower chamber 17. In the processing container 20, a rectangular annular support frame 14 is disposed at a boundary between the upper chamber 13 and the lower chamber 17 to project toward the inner side of the processing container 20. A metal window 50 is attached to the support frame 14.

The upper chamber 13 that defines the antenna chamber A has a sidewall 11 and a ceiling plate 12, and is entirely made of a metal such as aluminum or aluminum alloy.

The lower chamber 17 having the processing region S therein has a sidewall 15 and a bottom plate 16, and is entirely made of a metal such as aluminum or aluminum alloy. The sidewall 15 is grounded through a ground wire 21.

The support frame 14 is made of a conductive metal such as aluminum or aluminum alloy. The support frame 14 may also be referred to as "metal frame."

An endless rectangular annular sealing groove 22 is formed at an upper end of the sidewall 15 of the lower chamber 17. A sealing member 23 such as an O-ring or the like is fitted into the sealing groove 22 and held (press-contact) by the contact surface of the support frame 14, thereby forming a sealing structure between the lower chamber 17 and the support frame 14.

A loading/unloading port 18 for loading and unloading the substrate G into and from the lower chamber 17 is provided at the sidewall 15 of the lower chamber 17. The loading/unloading port 18 can be opened and closed by a gate valve 24. The lower chamber 17 is disposed adjacent to a transfer chamber having therein a transfer mechanism (both not shown). By controlling an on/off operation of the gate valve 24, the loading/unloading of the substrate G through the loading/unloading port 18 is performed by the transfer mechanism.

A plurality of gas exhaust ports 19 is formed at the bottom plate 16 of the lower chamber 17. The gas exhaust ports 19 are connected to gas exhaust line 25, respectively. Each of the gas exhaust lines 25 is connected to a gas exhaust device (GED) 27 through an opening/closing valve 26. The gas exhaust line 25, the opening/closing valve 26, and the gas exhaust device 27 constitute a gas exhaust unit 28. The gas exhaust device 27 has a vacuum pump such as a turbo molecular pump or the like and is configured to evacuate a pressure in the lower chamber 17 to a predetermined vacuum level during processing. A pressure gauge (not shown) is disposed at an appropriate position in the lower chamber 17, and monitoring information (data) from the pressure gauge is transmitted to the controller 90.

The substrate support 70 includes a base 73 and an electrostatic chuck 76 disposed on an upper surface 73*a* of the base 73.

The base 73 is a laminated body of an upper base 71 and a lower base 72. The upper base 71 has a rectangular shape in plan view and has plane dimensions similar to those of a FPD placed on the substrate support 70. For example, the upper base 71 has the same plane dimensions as those of the substrate G to be placed on the substrate support 70. The length of the long side can be set to be in a range from about 1800 mm to 3400 mm, and the length of the short side can be set to be in a range from about 1500 mm to 3000 mm. When the upper base 71 has such plane dimensions, the total thickness of the upper base 71 and the lower base 72 may be, e.g., in a range from about 50 mm to 100 mm.

A temperature control medium flow path 72*a* is formed in a curving and winding (serpentine) shape in the lower base 72 to cover the entire area of the rectangular plane. The lower base 72 is made of stainless steel, aluminum, aluminum alloy, or the like. The upper base 71 is also made of stainless steel, aluminum, aluminum alloy, or the like. The temperature control medium flow path 72*a* may be formed in, e.g., the upper base 71 or the electrostatic chuck 76. Further, the base 73 may not be a laminated body of two members as in the illustrated example and may be formed as one member made of aluminum, an aluminum alloy, or the like.

A box-shaped pedestal 78 made of an insulating material and having a stepped portion at an inner side thereof is fixed on the bottom plate 16 of the lower chamber 17. The substrate support 70 is mounted on the stepped portion of the pedestal 78.

An electrostatic chuck 76 on which the substrate G is directly mounted is disposed on an upper surface of the upper base 71. The electrostatic chuck 76 has a ceramic layer 74 that is a dielectric coating film formed by spraying a ceramic such as alumina or the like, and a conductive layer 75 (electrode) formed inside the ceramic layer 74 and having an electrostatic attraction function.

The conductive layer 75 is connected to a DC power supply 85 through a power supply line 84. When a switch (not shown) disposed in the power supply line 84 is turned on by the controller 90, a DC voltage is applied from the DC power supply 85 to the conductive layer 75 to generate a Coulomb force. Due to the Coulomb force thus generated, the substrate G is electrostatically attracted to and held on an upper surface of the electrostatic chuck 76 while being mounted on the upper surface of the upper base 71.

The temperature control medium flow path 72*a* is formed in the curving and winding (serpentine) shape in the lower base 72 constituting the substrate support 70 to cover the entire area of the rectangular plane. Both ends of the temperature control medium flow path 72*a* are connected to a feed line 72*b* for supplying the temperature control medium to the temperature control medium flow path 72*a* and a return line 72*c* for discharging the temperature control medium whose temperature is increased while flowing through the temperature control medium flow path 72*a*.

As shown in FIG. 1, the feed line 72*b* and the return line 72*c* are connected to a feed passage 87 and a return passage 88, respectively. The feed passage 87 and the return passage 88 are connected to a chiller 86. The chiller 86 has a main body for controlling a temperature or a discharge flow rate of the temperature control medium, and a pump for feeding the temperature control medium (both not shown). A coolant such as Galden (Registered Trademark), Fluorinert (Registered Trademark), or the like is used as the temperature control medium. In the illustrated example, the temperature control medium circulates through the lower base 72. However, a heater may be embedded in the lower base 72 and used for temperature control, or both the temperature control medium and the heater may be used for the temperature control. Alternatively, the temperature control using heating may be performed by circulating a high-temperature control medium instead of using the heater. The heater is a resistance heating member that is made of tungsten, molybdenum, or a compound of one of tungsten or molybdenum and one of alumina and titanium. In the illustrated example, the temperature control medium flow path 72a is formed in the lower base 72. However, the temperature control medium flow path may be formed in, e.g., the upper base 71 or the electrostatic chuck 76.

A temperature sensor such as a thermocouple or the like is embedded in the upper base 71, and information monitored from the temperature sensor is regularly transmitted to the controller 90. Based on the transmitted information, the temperatures of the upper base 71 and the substrate G are controlled by the controller 90. More specifically, the controller 90 adjusts the temperature and the flow rate of the temperature control medium supplied from the chiller 86 to the feed passage 87. By circulating the temperature control medium whose temperature or flow rate has been adjusted through the temperature control medium flow path 72a, the temperature of the substrate support 70 is controlled. The temperature sensor such as the thermocouple may be embedded in, e.g., the lower base 72 or the electrostatic chuck 76.

A stepped portion is formed by the outer circumferences of the electrostatic chuck 76 and the upper base 71 and the upper surface of the pedestal 78. A rectangular frame-shaped focus ring 79 is mounted on the stepped portion. An upper surface of the focus ring 79 is set to be lower than the upper surface of the electrostatic chuck 76 in a state where the focus ring 79 is disposed on the stepped portion. The focus ring 79 is made of ceramic such as alumina or quartz.

A power supply member 80 is connected to a bottom surface of the lower base 72. A power supply line 81 is connected to the lower end of the power supply member 80. The power supply line 81 is connected to a radio frequency power supply 83 that is a bias power supply through a matching device (MD) 82 for performing impedance matching. By applying a radio-frequency power of, e.g., 3.2 MHz, from the radio frequency power supply 83 to the substrate support 70, an RF bias power is generated, which makes it possible to attract ions generated by a radio frequency power supply 59 for plasma generation to be described below toward the substrate G. Therefore, in the plasma etching process, both of the etching rate and the etching selectivity can be increased. In addition, a through-hole (not shown) may be formed in the lower base 72, and the power supply member 80 may be connected to a bottom surface of the upper base 71 through the through-hole. In this manner, the substrate support 70 mounts thereon the substrate G and serves as a bias electrode that generates an RF bias power. At this time, a portion having a ground potential in the chamber functions as a facing electrode of the bias electrode and forms a radio frequency power return circuit. The metal window 50 may form a part of the radio frequency power return circuit.

The metal window 50 includes a plurality of divided metal windows 57. The divided metal windows 57 (four are shown in FIG. 1) of the metal window 50 may be provided in various numbers such as 12, 24, or the like.

Each of the divided metal windows 57 is insulated from the support frame 14 or the adjacent divided metal windows 57 by an insulating member 56. Here, the insulating member 56 is made of fluororesin such as Polytetrafluoroethylene (PTFE) or the like.

As shown in FIG. 2, each divided metal window 57 has a conductor plate 30 that is an example of the first conductive member and a shower plate 40 that is an example of the second conductive member. Both of the conductor plate 30 and the shower plate 40 are made of aluminum, aluminum alloy, stainless steel, or the like, which is a non-magnetic, conductive, and corrosion-resistant metal or a metal that has been subjected to corrosion resistant surface treatment. The corrosion resistant surface treatment is, e.g., anodic oxidation treatment, ceramic spraying, or the like. Further, the bottom surface of the shower plate 40 facing the processing region S may be subjected to plasma resistant coating using anodic oxidation treatment or ceramic spraying. The conductor plate 30 is grounded through a ground wire (not shown), and the shower plate 40 is grounded through the conductor plate 30 bonded thereto.

As shown in FIG. 1, a spacer (not shown) made of an insulating member is disposed above the divided metal windows 57, and radio frequency antennas 54 are disposed to be separated from the conductor plate 30 by the spacer. Each of the radio frequency antennas 54 is formed by winding an antenna wire made of a metal having high conductivity such as copper or the like in an annular shape or in a spiral shape. For example, multiple annular antenna wires may be arranged to form each radio frequency antenna 54.

Further, the radio frequency antennas 54 are connected to a power supply member 57a extending to a position above the upper chamber 13. An upper end of the power supply member 57a is connected to a power supply line 57b. The power supply line 57b is connected to the radio frequency power supply 59 through a matching device (MD) 58 for performing impedance matching. An induced electric field is generated in the lower chamber 17 by applying a radio frequency power of, e.g., 13.56 MHz, from the radio frequency power supply 59 to the radio frequency antennas 54. Due to the induced electric field, the processing gas supplied from the shower plate 40 to the processing region S is turned into plasma, and inductively coupled plasma is generated. The ions in the plasma are to be attracted to the substrate G.

The radio frequency power supply 59 is a plasma generation source. The radio frequency power supply 83 connected to the substrate support 70 is a bias source for applying kinetic energy by attracting the generated ions. By generating the plasma using inductive coupling from the ion source and performing ion energy control using the bias source that is another power source connected to the substrate support 70, the plasma generation and the ion energy control are individually performed. Therefore, the degree of freedom of the process can be increased. The frequency of the radio frequency power outputted from the radio frequency power supply 59 is preferably set within a range from 0.1 MHz to 500 MHz.

The metal window 50 includes the plurality of divided metal windows 57 respectively suspended from the ceiling plate 12 of the upper chamber 13 by multiple suspenders (not shown). Further, the radio frequency antennas 54 that contribute to the plasma generation are arranged above the upper surfaces of the divided metal windows 57. Thus, the radio frequency antennas 54 are suspended from the ceiling plate 12 by suspending the divided metal windows 57 from the ceiling plate 12.

Referring back to FIG. 2, a gas diffusion groove 34 is formed on a bottom surface of a conductor plate main body 31 of the conductor plate 30. The conductor plate main body 31 has a through-hole 31b through which an upper surface 31a of the conductor plate main body 31 communicates with the gas diffusion groove 34. A gas inlet line 55 is disposed in the through-hole 31b. The gas diffusion groove may be formed on an upper surface of the shower plate.

The gas inlet line 55 has a flange 55a in the middle thereof, and a bottom surface of the flange 55a is placed on the upper surface 31a of the conductor plate main body 31.

On a placing surface of the upper surface 31a of the conductor plate main body 31 where the flange 55a is disposed, an endless sealing groove 39a surrounding the gas inlet line 55 is formed. A sealing member 39b such as an O-ring or the like is fitted into the sealing groove 39a and held (press-contact) by the bottom surface of the flange 55a, thereby forming a sealing structure between the gas inlet line 55 and the conductor plate main body 31.

A shower plate main body 41 of the shower plate 40 has a plurality of gas injection holes 44 extending through the shower plate main body 41 and communicating with the gas diffusion grooves 34 of the conductor plate 30 and the processing region S.

As shown in FIG. 1, the respective gas inlet lines 55 of the divided metal windows 57 join into a single line in the antenna chamber A. The joined gas inlet line 55 airtightly extends through a supply hole 12a formed at the ceiling plate 12 of the upper chamber 13. Then, the joined gas inlet line 55 is connected to a processing gas supply source (PGSS) 64 through a gas supply line 61 airtightly connected thereto.

An opening/closing valve 62 and a flow rate controller (FRC) 63 such as a mass flow controller are provided in the gas supply line 61. The gas supply line 61, the opening/closing valve 62, the flow rate controller 63, and the processing gas supply source 64 constitute a processing gas supply unit 60. The gas supply line 61 is branched into branch lines, and the branch lines are connected to processing gas supply sources suitable for types of processing gases through opening/closing valves and flow rate controllers (all not shown).

In the plasma processing, the processing gas supplied from the processing gas supply unit 60 reaches the gas diffusion grooves 34 of the conductor plates 30 of the divided metal windows 57 through the gas supply line 61 and the gas inlet lines 55. Then, the gas is injected from the gas diffusion grooves 34 to the processing region S through the gas injection holes 44 of each of the shower plates 40.

The gas inlet lines 55 of the divided metal windows 57 may not join into the single line and individually communicate with the processing gas supply unit 60 so that the supply of the processing gas to the divided metal windows 57 can be individually controlled. Alternatively, the gas inlet lines 55 of the outer-side divided metal windows 57 of the metal window 50 may join into one line, and the gas inlet lines 55 of the inner-side divided metal windows 57 of the metal window 50 may join into one line. In that case, those gas inlet lines 55 individually communicate with the processing gas supply unit 60 so that the supply of the processing gas can be individually controlled. In other words, in the former case, the processing gas supply control is performed for each of the divided metal windows 57. In the latter case, the processing gas supply control is individually performed for an outer region and an inner region of the metal window 50.

In addition, each divided metal window 57 may have their own radio frequency antennas, and the radio frequency power may be applied to the individual radio frequency antennas.

The controller 90 controls the operations of the respective components of the substrate processing apparatus 100. For example, the controller 90 controls the operations of the chiller 86, the radio frequency power supplies 59 and 83, and the processing gas supply unit 60, and the operation of the gas exhaust unit 28 based on the monitoring information transmitted from the pressure gauge. The controller 90 has a central processing unit (CPU), a read only memory (ROM), and a random access memory (RAM). The CPU executes predetermined processing based on a recipe (processing recipe) stored in a storage area of the RAM or the ROM. Control information of the substrate processing apparatus 100 depending on processing conditions is set in the recipe. The control information includes, e.g., a gas flow rate, a pressure in the processing container 20, a temperature in the processing container 20, a temperature of the lower base 72, processing time, and the like.

The recipe and the program applied by the controller 90 may be stored in, e.g., a hard disk, a compact disk, a magneto-optical disk, or the like. Further, the recipe or the like may be set and read out in the controller 90 while being stored in a portable computer-readable storage medium such as a CD-ROM, a DVD, or a memory card. The controller 90 further includes a user interface such as an input device including, e.g., a keyboard, a mouse, or the like for inputting commands, a display device including, e.g., a display or the like for visualizing and displaying the operation status of the substrate processing apparatus 100, and an output device including, e.g., a printer or the like.

<Bonding Structure and Bonding Method for Bonding First Conductive Member and Second Conductive Member>

Figure 3:
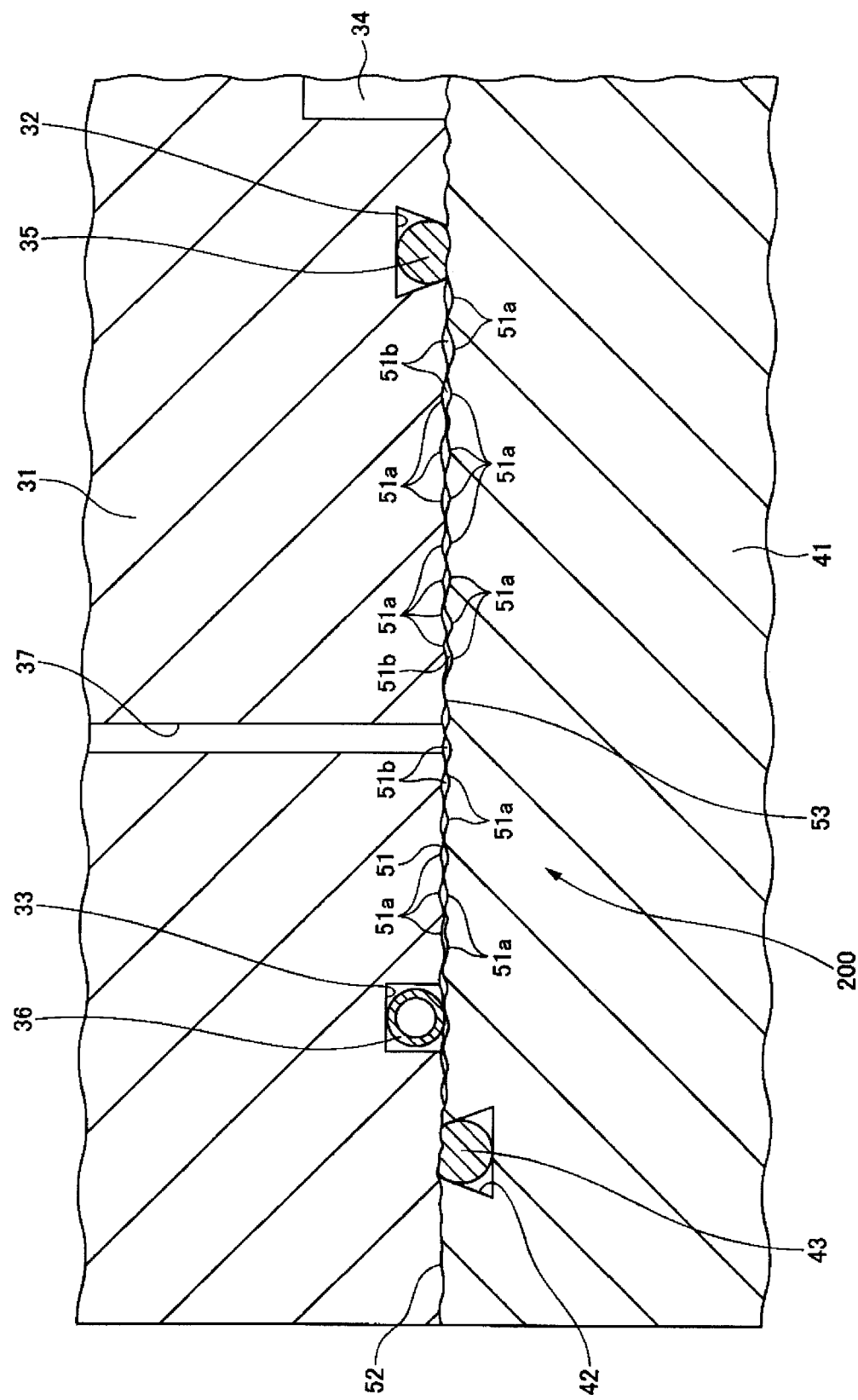
FIG. 3 is an enlarged view of a "III" portion of FIG. 2.

Next, an example of a bonding structure and an example of a bonding method for bonding the first conductive member and the second conductive member according to the embodiment will be described with reference to FIGS. 2 and 3. FIG. 3 is an enlarged view of a "III" portion of FIG. 2. As described above, the conductor plate 30 is described as the first conductive member and the shower plate 40 is described as the second conductive member. However, the first conductive member and the second conductive member may be appropriate two members that are brought into contact with each other and constitute the substrate processing apparatus 100.

The conductor plate 30 and the shower plate 40 are bonded to each other through a bonding interface 51 that surrounds the gas diffusion groove 34 of the conductor plate 30. For example, when the gas diffusion groove 34 has a rectangular shape in plan view, the bonding interface 51 has a rectangular frame shape in plan view.

An endless first sealing groove (a continuously extending sealing groove) 32 and an endless second sealing groove (a continuously extending sealing groove) 42 face the bonding interface 51 while being separated from each other on the bonding interface 51. A first sealing member 35 is fitted in the first sealing groove 32, and a second sealing member 43 is fitted in the second sealing groove 42.

More specifically, the endless first sealing groove 32 facing the bonding interface 51 is formed beside the gas diffusion groove 34 in the conductor plate 30, and the first sealing member 35 that is an O-ring is fitted in the first sealing groove 32. On the other hand, the endless second sealing groove 42 facing the bonding interface 51 is formed beside the insulating member 56 in the shower plate 40 while being separated from the first sealing groove 32. The second sealing member 43 that is an O-ring is fitted in the second sealing groove 42.

Here, the O-ring may be made of, e.g., nitrile rubber (NBR), fluoro rubber (FKM), or silicone rubber (Q). Further, fluorosilicone rubber (FVMQ), perfluoropolyether rubber (FO), acrylic rubber (ACM), and ethylene propylene rubber (EPM) may be also used.

The first sealing member 35 and the second sealing member 43, which are the O-rings, are held (press-contact) by the contact surfaces of the facing plates (the shower plate 40 or the conductor plate 30) forming the bonding interface 51, thereby forming a sealing structure between the shower plate 40 and the conductor plate 30.

As alternative examples, both of the first sealing groove 32 and the second sealing groove 42 may be formed at the conductor plate 30, or both of the first sealing groove 32 and the second sealing groove 42 may be formed at the shower plate 40. Further, the first sealing groove 32 and the second sealing groove 42 may be formed at the shower plate 40 and the conductor plate 30, respectively.

In the conductor plate 30, an endless conductive groove 33 facing the bonding interface 51 is formed at an inner side position from the second sealing groove 42 of the shower plate 40, and a shield spiral 36 is fitted in the conductive groove 33. The shield spiral 36 is made of, e.g., a metal such as aluminum, stainless steel, copper, iron, or the like. Further, the shield spiral 36 has a function of ensuring electrical conduction between the shower plate 40 and the conductor plate 30 and maintaining the shower plate 40 at a specific potential, e.g., a ground potential.

On the bonding interface 51, a vacuum connecting portion 52 is formed at an outer side position from the second sealing groove 42. The vacuum connecting portion 52 is formed by vacuum-connecting the contact surface of the conductor plate 30 and the contact surface of the shower plate 40.

Further, on the bonding interface 51, an air connecting portion 53 is formed between the first sealing groove 32 and the second sealing groove 42. The air connecting portion 53 is formed by introduction of air. Further, the bonding interface 51 communicates with the gas diffusion groove 34 at an inner side position from the first sealing groove 32.

Next, the air connecting portion 53 will be described in detail with reference to FIG. 3.

As shown in FIG. 3, the contact surface of the conductor plate 30 and the contact surface of the shower plate 40, which form the bonding interface 51, have microscopic surface irregularities (concave-convex surface) 51a. A plurality of minute gaps 51b is formed due to the surface irregularities 51a on the contact surfaces. The air connecting portion 53 is formed by the minute gaps 51b.

As shown in FIG. 3, the conductor plate main body 31 has an air inlet hole 37 facing the air connecting portion 53. As shown in FIG. 2, the air inlet hole 37 is formed through the conductor plate main body 31 and faces the upper surface 31a of the conductor plate main body 31.

An air inlet line 38 is connected to communicate with the opening of the air inlet hole 37 facing the upper surface 31a of the conductor plate main body 31. As shown in FIG. 1, in the illustrated example, an inlet branch line 38a in communication with the air inlet hole 37 of each divided metal window 57 communicates with an inlet main line 38b, and the air inlet line 38 is formed by the inlet main line 38b and the multiple inlet branch lines 38a. The inlet main line 38b airtightly penetrates through the sidewall 11 and faces an outside region E. Alternatively, the air inlet lines dedicated for the respective divided metal windows 57 may individually penetrate through the sidewall 11 and face the outside region E.

Air reaches the multiple minute gaps 51b forming the air connecting portion 53 through the air inlet line 38 facing the outside region E and the air inlet hole 37. In other words, the air connecting portion 53 is formed in a state where air is introduced into the minute gaps 51b formed by the surface irregularities 51a due to point contacts or line contacts between the surface irregularities 51a on the contact surfaces of the conductor plate 30 and the shower plate 40. Alternatively, when the antenna chamber A is in an atmospheric environment, the air inlet line 37, the inlet branch lines 38a, and the inlet main line 38b may not be provided, and the air inlet holes 37 may be directly exposed to the antenna chamber A so that air can be introduced into the minute gaps 51b.

Further, the vacuum connecting portion 52 formed at an outer peripheral side of the air connecting portion 53 is a portion where the conductor plate 30 and the shower plate 40 are vacuum-connected at an outer peripheral portion of the bonding interface 51.

On the bonding interface 51, the second sealing member 43 fitted in the second sealing groove 42 is disposed at an outer peripheral portion of the air connecting portion 53, and the sealing structure is formed between the contact surfaces of the second sealing member 43 and the conductor plate 30. With this configuration, it is possible to prevent air in the air connecting portion 53 from leaking to the processing region S of the lower chamber 17 through the vacuum connecting portion 52.

Further, the first sealing member 35 fitted in the first sealing groove 32 is disposed at the inner peripheral portion of the air connecting portion 53, and the sealing structure is formed between the contact surfaces of the first sealing member 35 and the shower plate 40. With this configuration, it is possible to prevent air in the air connecting portion 53 from leaking to the gas diffusion groove 34 and also possible to prevent the processing gas in the gas diffusion groove 34 from leaking to the air connecting portion 53.

As described above, the bonding structure 200 for bonding the first conductive member and the second conductive member has, on the bonding interface 51 between the conductor plate 30 that is an example of the first conductive member and the shower plate 40 that is an example of the second conductive member, the air connecting portion 53 formed by introducing air into the multiple minute gaps 51b on the bonding interface 51.

The following is a brief description of an example of the bonding method for bonding the conductor plate 30 that is the example of the first conductive member and the shower plate 40 that is the example of the second conductive member.

First, the bonding interface 51 is formed by bonding the conductor plate 30 and the shower plate 40.

When the bonding interface 51 is formed, the endless first sealing groove 32 facing the bonding interface 51 is formed beside the gas diffusion groove 34 in the conductor plate 30. Then, the first sealing member 35 is fitted in the first sealing groove 32. Further, the endless second sealing groove 42 facing the bonding interface 51 is formed beside the insulating member 56 in the shower plate 40 while being separated from the first sealing groove 32. Then, the second sealing member 43 is fitted in the second sealing groove 42.

In the case of forming the bonding interface 51 by bonding the conductor plate 30 and the shower plate 40, the minute gaps 51b are formed due to the surface irregularities 51a on the contact surfaces the conductor plate 30 and the shower plate 40. Then, the air connecting portion 53 is formed by the multiple minute gaps 51b.

In the conductor plate main body 31, the air inlet hole 37 facing the air connecting portion 53 is formed. By establishing the communication between the air inlet hole 37 and the outside region E, air is introduced into the multiple minute gaps 51b, thereby forming the air connecting portion 53 of the bonding structure 200 for bonding the first conductive member and the second conductive member.

Due to the presence of the air connecting portion 53 on the bonding interface 51 between the conductor plate 30 and the shower head 40, the thermal conductivity between the conductor plate 30 and the shower plate 40 is improved compared to the case where the vacuum connecting portion is merely formed on the entire bonding interface. This is because the vacuum functions as a heat insulating layer, whereas gas molecules in the air function as a heat transfer layer that transfers heat. Since the thermal conductivity between the conductor plate 30 and the shower plate 40 is improved, it is possible to suppress uneven temperature distribution within each divided metal window 57 or uneven temperature distribution between the multiple divided metal windows 57 of the metal window 50.

Each of the divided metal windows 57 has a double sealing structure including the sealing structure formed by the first sealing member 35 at the inner peripheral portion of the bonding interface 51 and another sealing structure formed by the second sealing member 43 at the outer peripheral portion of the bonding interface 51. With this configuration, it is possible to prevent the processing atmosphere in the processing region S from reaching the bonding interface 51. Accordingly, it is possible to avoid deposition of deposits and generation of particles caused by peeling of the deposits on the bonding interface 51. The suppression of deposition of deposits or the suppression of generation of particles leads to the suppression of conduction failure between the conductor plate 30 and the shower plate 40 caused by the deposits or the particles.

In addition, the corrosion of the bonding interface 51 due to the contact between various processing gases in the processing region S and the bonding interface 51 is suppressed. The suppression of corrosion of the bonding interface 51 leads to the suppression of conduction failure between the conductor plate 30 and the shower plate 40 caused by the corrosion of the bonding interface 51.

Although it is not illustrated, the air connecting portion 53 may be formed at the bonding interface 51 by another method different from the method of the illustrated example in which the air inlet hole 37 communicating with the bonding interface 51 and the outside region E is formed at the conductor plate 30. For example, the sealing member 39b for sealing the gap between the bottom surface of the flange 55a of the gas inlet line 55 and the upper surface of the conductor plate main body 31 may be removed, and the interface between the through-hole 31b and the gas inlet line 55 may be used as an air inlet interface through which air is introduced into the air connecting portion.

<Method for Inspecting Sealing Performance of Bonding Structure for Bonding a First Conductive Member and a Second Conductive Member>

Figure 4:
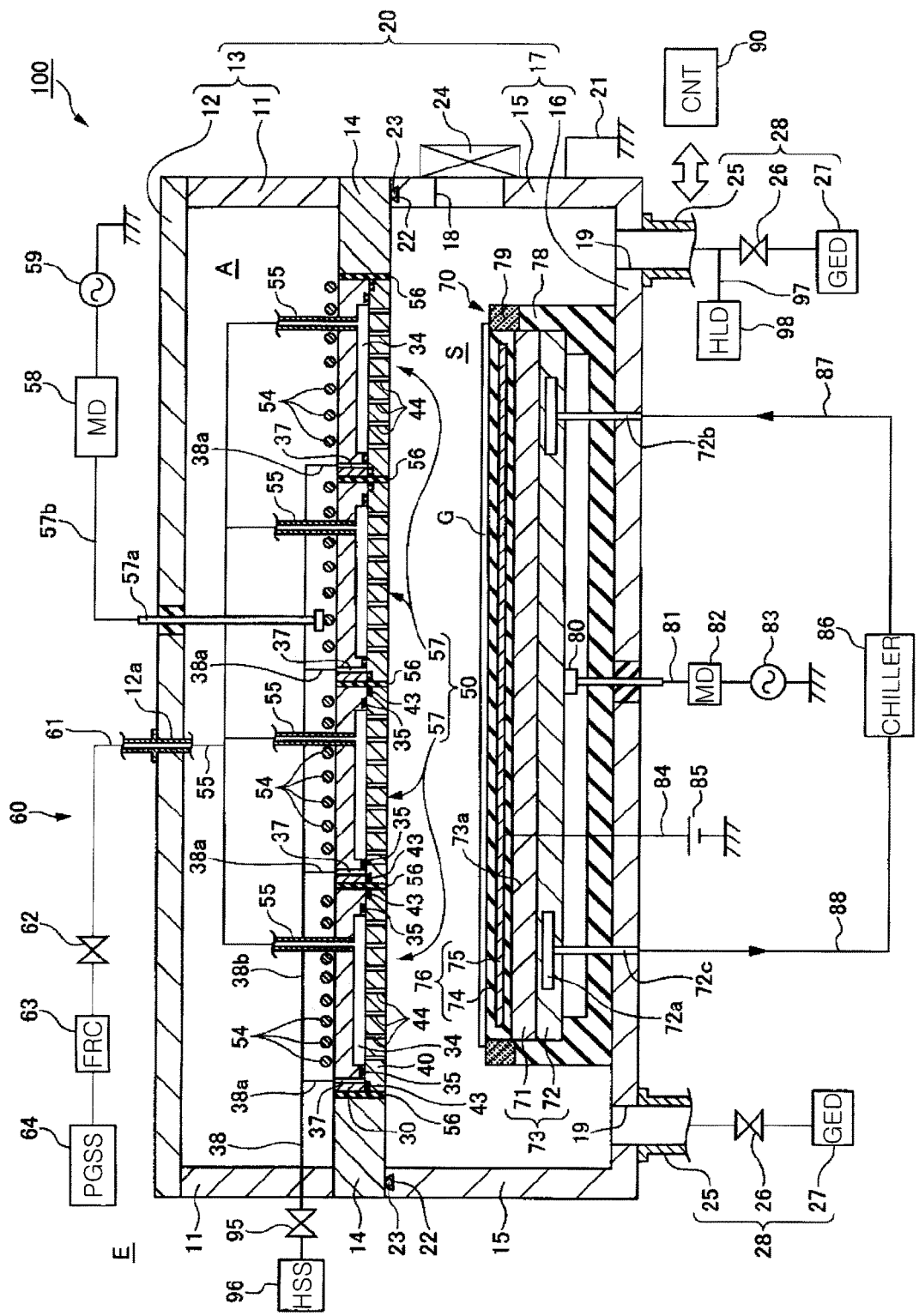
FIG. 4 shows a method for inspecting a sealing performance of the bonding structure for bonding the first conductive member and the second conductive member.

Next, the method for inspecting a sealing performance of the bonding structure for bonding the first conductive member and the second conductive member will be described with reference to FIG. 4. FIG. 4 shows the method for inspecting the sealing performance of the bonding structure for bonding the first conductive member and the second conductive member. The vertical cross-sectional view of FIG. 1 is applied to FIG. 4.

Since each of the divided metal windows 57 constituting the metal window 50 of the substrate processing apparatus 100 has the air connecting portion 53 at the bonding interface 51 between the conductor plate 30 and the shower plate 40, the sealing performance of the sealing structure formed by the second sealing member 43 becomes significant. In other words, the sealing structure formed by the second sealing member 43 prevents air from leaking from the air connecting portion 53 to the processing region S of the lower chamber 17. Such a problem does not occur when the vacuum connecting portion is formed on the entire bonding interface between the conductor plate and the shower plate.

Therefore, in the substrate processing apparatus 100, the leakage inspection, in which air leakage from the air connecting portion 53 to the processing region S is inspected, is performed at appropriate stages until the substrate processing apparatus 100 is manufactured, in particular at least at the stage of manufacturing the metal window 50. The leakage inspection may be performed between the substrate treatments. In this case, it is possible to detect the deterioration of the sealing property of the sealing structure.

In the leakage inspection, as shown in FIG. 4, an opening/closing valve 95 is attached to the air inlet line 38 facing the outside region E through the sidewall 11 of the upper chamber 13, and a helium supply source (HSS) 96 is connected to the air inlet line 38 through the opening/closing valve 95. In other words, in the leakage inspection, the air leakage from the air connecting portion 53 is inspected by checking the presence of helium leakage.

Further, an inspection line 97 is disposed in one or all of the gas exhaust lines 25 constituting one or all of the gas exhaust units 28, and a helium leakage detector (HLD) 98 is disposed in the inspection line 97. Although the helium leakage detector 98 is disposed in one of the gas exhaust units 28 in the illustrated example, the helium leak detector 98 may be disposed in all of the gas exhaust units 28. In this case, the divided metal window 57 near the helium leakage detector 98 having a high helium concentration can be specified as the divided metal window 57 where helium is leaking. Accordingly, the divided metal window causing helium leakage can be easily specified.

In the inspection, first, the opening/closing valve 95 is closed, and the gas exhaust unit 28 operates to create a desired vacuum atmosphere in the processing region S. Next, the opening/closing valve 95 is opened, and a helium gas is supplied from the helium supply source 96 to the air connecting portion 53 of each divided metal window 57 through the air inlet line 38 and the air inlet hole 37.

The helium leakage detector 98 operates at appropriate timings to detect whether or not helium is detected or to measure a helium concentration when helium is detected. When helium is not detected, or when the detected helium concentration is lower than or equal to a predetermined reference value, it is determined that the sealing structure formed by the second sealing member 43 of each divided metal window 57 has the desired sealing performance. On the other hand, when the detected helium concentration exceeds the predetermined reference value, the troubleshooting for the sealing structure formed by the second seal member 43 of each divided metal window 57 is performed, and a countermeasure such as replacement of the sealing structure of the divided metal window 57 that causes the helium leakage or the like is performed.

The present disclosure is not limited to the configurations illustrated in the above embodiments, and various modifications such as combinations with other elements can be made without departing from the spirit of the present disclosure and can be appropriately determined depending on its application.

For example, although the substrate processing apparatus 100 has been described as an inductively coupled plasma processing apparatus having a metal window in the illustrated example, the substrate processing apparatus may be an inductively coupled plasma processing apparatus having a dielectric window instead of the metal window or may be another plasma processing apparatus using, e.g., electron cyclotron resonance plasma (ECP), helicon wave excited plasma (HWP), parallel plate plasma (capacitively coupled plasma; CCP), and microwave excited surface wave plasma (Surface Wave Plasma; SWP). These plasma processing apparatuses including an inductively coupled plasma (ICP) processing apparatus can independently control ion flux and ion energy, so that the etching shape or the selectivity can be freely controlled and a high electron density of about $10^{11}$ cm$^{-3}$ to $10^{13}$ cm$^{-3}$ can be obtained.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A bonding structure for bonding a first conductive member and a second conductive member forming a processing container having therein a processing region for processing a substrate, the processing region being isolated from an outside region, the bonding structure comprising:
 a bonding interface formed between the first conductive member and the second conductive member;
 an endless first sealing groove and an endless second sealing groove facing the bonding interface while being separated from each other;
 a first sealing member fitted in the first sealing groove and a second sealing member fitted in the second sealing groove; and
 gaps formed by surface irregularities of the bonding interface between the first sealing groove and the second sealing groove that communicate with the outside region.

2. The bonding structure of claim 1, wherein the first conductive member has an air inlet hole communicating with the gaps, and
 the air inlet hole communicates with the outside region.

3. The bonding structure of claim 2, wherein the air inlet hole communicates with a helium gas supply source.

4. The bonding structure of claim 1, wherein both of the first conductive member and the second conductive member are made of a corrosion-resistant metal or a metal that has been subjected to corrosion resistant surface treatment.

5. The bonding structure of claim 1, wherein the second conductive member is a shower plate having a plurality of gas injection holes for injecting a processing gas into the processing region,
 the first conductive member is a conductor plate forming a metal window, and
 a gas diffusion groove communicating with the injection gas holes is formed at an inner side of the bonding interface.

6. A substrate processing apparatus comprising:
 a processing container having therein a processing region for processing a substrate, the processing region being isolated from an outside region,
 wherein the processing container includes a first conductive member and a second conductive member,
 the first conductive member and the second conductive member have a bonding interface therebetween,
 an endless first sealing groove and an endless second sealing groove face the bonding interface while being separated from each other,
 a first sealing member is fitted in the first sealing groove and a second seal member is fitted in the second sealing groove, and
 gaps formed by surface irregularities of the bonding interface between the first sealing groove and the second sealing groove communicate with the outside region.

7. The substrate processing of claim 6, wherein the first conductive member has an air inlet hole communicating with the gaps, and
 the air inlet hole communicates with the outside region.

8. The substrate processing apparatus of claim 7, wherein the air inlet hole communicates with a helium gas supply source.

9. The substrate processing apparatus of claim 6, wherein the first conductive member has a through-hole, and a gas inlet line is disposed in the through-hole, and
 an interface between the through-hole and the gas inlet line serves as an air inlet interface, and the air inlet interface communicates with the gaps of the bonding interface and the outside region.

10. The substrate processing apparatus of claim 6, wherein both of the first conductive member and the second conductive member are made of a corrosion-resistant metal or a metal that has been subjected to corrosion resistant surface treatment.

11. The substrate processing apparatus of claim 6, wherein the second conductive member is a shower plate having a plurality of gas injection holes for injecting a processing gas into the processing region,
 the first conductive member is a conductor plate forming a metal window, and
 a gas diffusion groove communicating with the gas injection holes is formed at an inner side of the bonding interface.

12. The substrate processing apparatus of claim 11, wherein the metal window is divided into a plurality of divided metal windows,
 each of the divided metal windows has the conductor plate and the shower plate dedicated therefor.

13. The substrate processing apparatus of claim 11, wherein the shower plate is grounded through the conductor plate.

14. A bonding method for bonding a first conductive member and a second conductive member forming a processing container having therein a processing region for processing a substrate, the processing region being isolated from an outside region, the bonding method at least comprising:
 forming a bonding interface between the first conductive member and the second conductive member,
 wherein said forming the bonding interface includes:
 respectively fitting a first sealing member and a second sealing member in an endless first sealing groove and an endless second sealing groove being separated from each other; and
 allowing gaps formed by surface irregularities of the bonding interface between the first sealing groove and the second sealing groove to communicate with the outside region.

* * * * *